(12) United States Patent
Hunter

(10) Patent No.: US 6,201,698 B1
(45) Date of Patent: Mar. 13, 2001

(54) MODULAR ELECTRONICS PACKAGING SYSTEM

(75) Inventor: Don J. Hunter, La Verne, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/265,728

(22) Filed: Mar. 9, 1999

Related U.S. Application Data

(60) Provisional application No. 60/077,601, filed on Mar. 9, 1998.

(51) Int. Cl.[7] ............................... H05K 7/20; H05K 5/00
(52) U.S. Cl. .......................... 361/704; 361/715; 361/732; 361/735; 361/759
(58) Field of Search ...................................... 257/685, 686; 361/704, 707, 709–710, 714–716, 728–735, 740, 744, 759, 801–803

(56) References Cited

U.S. PATENT DOCUMENTS

| | | | |
|---|---|---|---|
| 4,558,914 | * | 12/1985 | Praser et al. ........................... 361/730 |
| 4,764,846 | * | 8/1988 | Go ......................................... 361/707 |
| 4,953,058 | * | 8/1990 | Harris .................................... 361/704 |
| 5,644,473 | * | 7/1997 | Derouiche ............................. 361/732 |
| 5,731,956 | * | 3/1998 | Nicolici ................................. 361/715 |
| 5,754,405 | * | 5/1998 | Derouiche ............................. 361/744 |
| 5,761,042 | * | 6/1998 | Widmayer et al. ................... 361/704 |

\* cited by examiner

*Primary Examiner*—Gregory Thompson
(74) *Attorney, Agent, or Firm*—Fish & Richardson, P.C.

(57) ABSTRACT

A modular electronics packaging system includes multiple packaging slices that are mounted horizontally to a base structure. The slices interlock to provide added structural support. Each packaging slice includes a rigid and thermally conductive housing having four side walls that together form a cavity to house an electronic circuit. The chamber is enclosed on one end by an end wall, or web, that isolates the electronic circuit from a circuit in an adjacent packaging slice. The web also provides a thermal path between the electronic circuit and the base structure. Each slice also includes a mounting bracket that connects the packaging slice to the base structure. Four guide pins protrude from the slice into four corresponding receptacles in an adjacent slice. A locking element, such as a set screw, protrudes into each receptacle and interlocks with the corresponding guide pin. A conduit is formed in the slice to allow electrical connection to the electronic circuit.

9 Claims, 4 Drawing Sheets

MODULAR ELECTRONICS PACKAGING SYSTEM

CROSS REFERENCE TO RELATED APPLICATIONS

This application claims the benefit of U.S. Provisional Application 60/077,601, filed on Mar. 9, 1998.

STATEMENT AS TO FEDERALLY SPONSORED RESEARCH

The invention described herein was made in the performance of work under a NASA contract, and is subject to the provisions of Public Law 96-517 (35 USC 20) in which the Contractor has elected to retain title.

TECHNOLOGICAL FIELD

The invention relates to electronics packaging.

BACKGROUND

Solutions for low mass and volumetric challenges in electronics packaging for space-based exploration and communication equipment have traditionally focused on vertically mounted 3-D packaging technologies. Vertical mounting involves stacking slices in a vertical configuration from a base slice. All other slices are supported mechanically by the base slice.

One problem associated with vertical mounting techniques is difficulty in conforming to mechanical limitations on the vertical height of the packaging structure. Another problem is difficulty in delivering thermal loads between the top of the vertical stack and the base structure. Designers of space-based equipment have devoted tremendous resources to alleviating these height and heat delivery problems. Traditional vertical mounting techniques also require disassembly of the entire packaging structure to add or remove an individual slice within the structure.

SUMMARY

This application discloses an electronic packaging system that provides improved system modularity and scalability by orienting and mounting packaging slices horizontally, as opposed to the traditional vertical mounting. In one aspect, the invention features a modular electronics packaging system having multiple packaging slices. A first one of the slices includes an electronic circuit and a housing that holds the electronic circuit. One or more retainers protrude from the housing. A conduit is formed in the housing to allow electrical connection to the electronic circuit.

A second one of the packaging slices also includes an electronic circuit and a housing to hold the electronic circuit. One or more receptacles are formed in the housing of this slice, and receptacle is coupled to one of the retainers protruding from the first slice. A conduit formed in the housing of the second slice allows electrical connection to the enclosed electronic circuit.

In some embodiments, the packaging system includes one or more interlocking elements formed in one or more of the receptacles of the second packaging slice to interlock with one or more of the retainers extending from the first packaging slice. In some cases, each of the interlocking elements includes a set screw that engages one of the retainers and a hole formed in the housing to accommodate the set screw.

In other embodiments, each housing includes at least four walls and an end wall, or web, defining a cavity in which the electronic circuit resides. In many cases, the housings are made from structurally rigid and thermally conductive materials.

One advantage of the disclosed packaging system is the scalability achieved by adding any number of additional slices. This scalability allows the system designer to maximize spacecraft volume. The disclosed system also allows slice removal one slice at a time, thus eliminating the need to disassemble the entire module. When each slice contacts the base structure directly, each slice provides a direct thermal path between the enclosed electronic circuit and the base structure.

Each slice also provides a mechanical load path to the base structure. Horizontally mounted packaging systems are able to withstand a large range of temperature variations, in some cases from cryogenic to more than 200° C. As a result, the packaging system is useful in a wide variety of applications, particularly those involving space-based exploration and communication systems.

Other embodiments and advantages will become apparent from the following description and from the claims.

DETAILED DESCRIPTION

Figure 1:
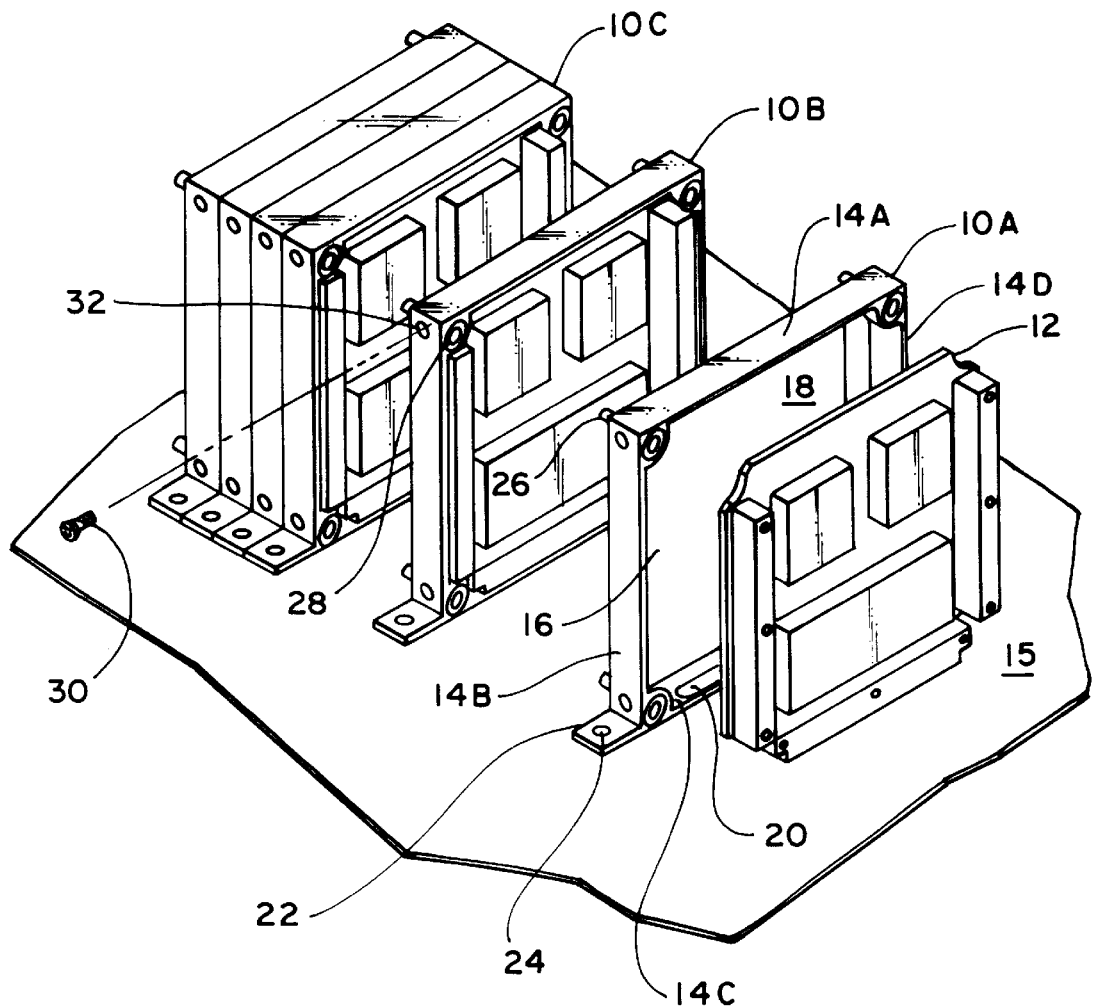
FIG. 1 is a perspective view of a modular electronics packaging system.

FIG. 1 shows a modular electronics packaging system that includes one or more interlocking slices 10A, 10B, 10C mounted horizontally to a base structure 15. In this horizontally mounted system, many and usually all of the packaging slices mount directly to the base structure. The slices are not stacked onto a base slice. Each of the slices 10A–C houses an electronic circuit 12. The slices 10A–C have a uniform construction to ensure that the slices 10A–C interlock properly and to allow the addition of any number of slices to create a packaging system module. For most applications, the slices 10A–C are constructed from one of a variety of rigid, thermally conductive materials, including metals and metal alloys such as aluminum. Some applications require the use of thermally insulating materials, such as molded plastic and composites.

Each of the slices 10A–C includes a housing that has one or more side walls 14A, 14B, 14C, 14D, and an end wall, or web 18. The side walls and the web together create a cavity 16 to house the electronic circuit 12. In the example of FIG. 1, each of the slices includes four side walls and one web that give the module a narrow cube shape. The web 18 performs several functions, including attaching the electronic circuit 12 to the slice, physically isolating the electronic circuit 12 from the components of an adjacent slice, shielding the electronic circuit 12 from electromagnetic interference, providing structural support for the slice, and providing a thermal path from the electronic circuit 12 to the base structure 15. The housing includes a conduit 20, such as openings along one or more edges, which allow the electronic circuit 12 to connect electrically to the adjacent slices or to other electronic components or assemblies.

Each of the shown slices 10A–C includes a mounting element 22 that allows connection of the slices to the base structure 15. The shown mounting element includes a hole 24 through which a screw is placed to mount the slice. Each of the slices 10A–C also includes one or more retaining elements 26 that mate with corresponding receptacles 28 in an adjacent slice. The retaining elements 26 ensure that the slices 10A–C align properly. In some systems, the retaining elements interlock securely with adjacent slices. One technique for interlocking adjacent slices is by using a locking element 30, such as a set screw inserted through a hole 32 in the receptacle 28 of one slice, to engage the retaining element 26 of an adjacent slice.

Figure 2:
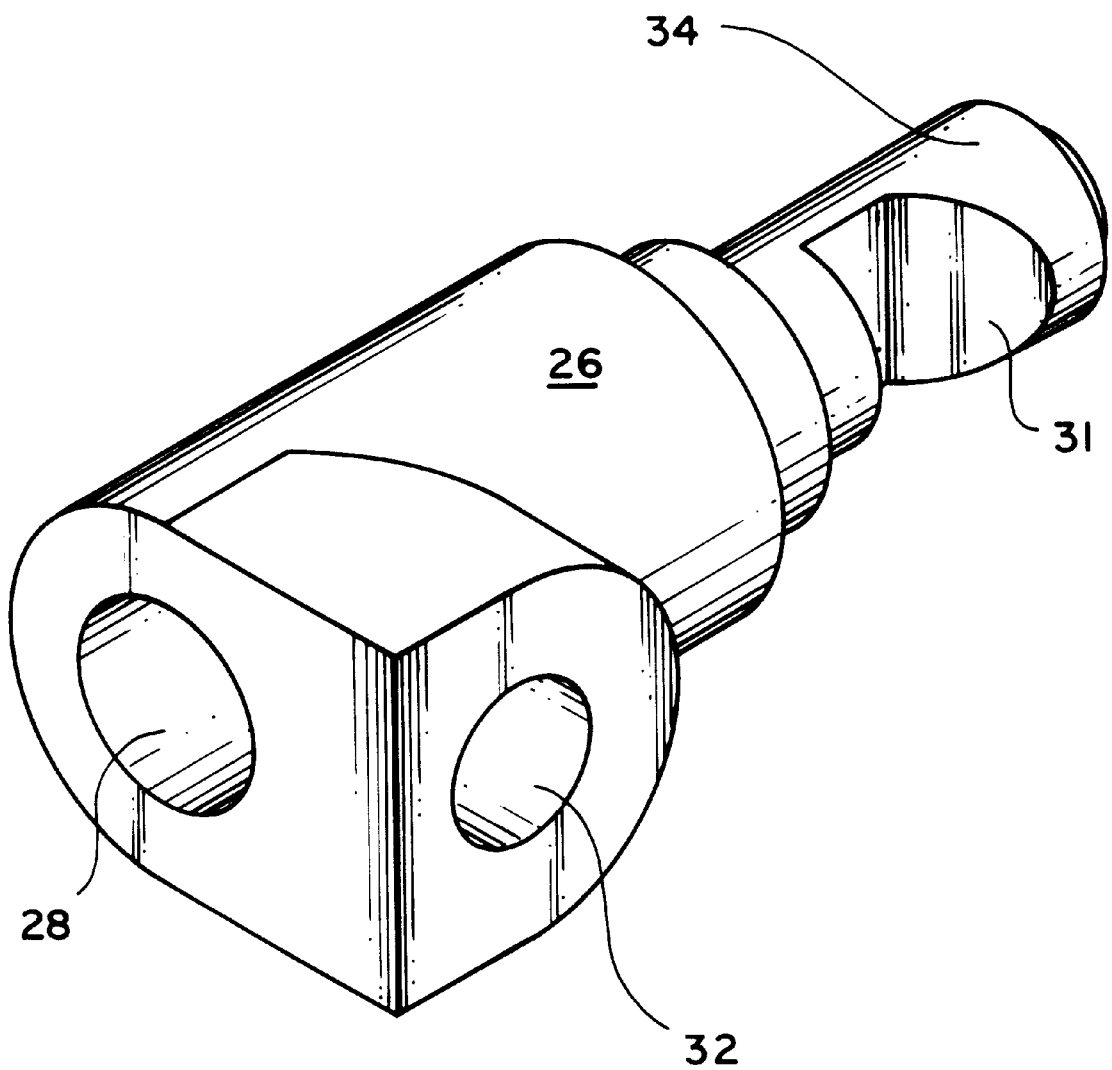
FIG. 2 is a cross-sectional view of a guide pin for use in interlocking adjacent packaging modules in the system of FIG. 1.
Figure 3:
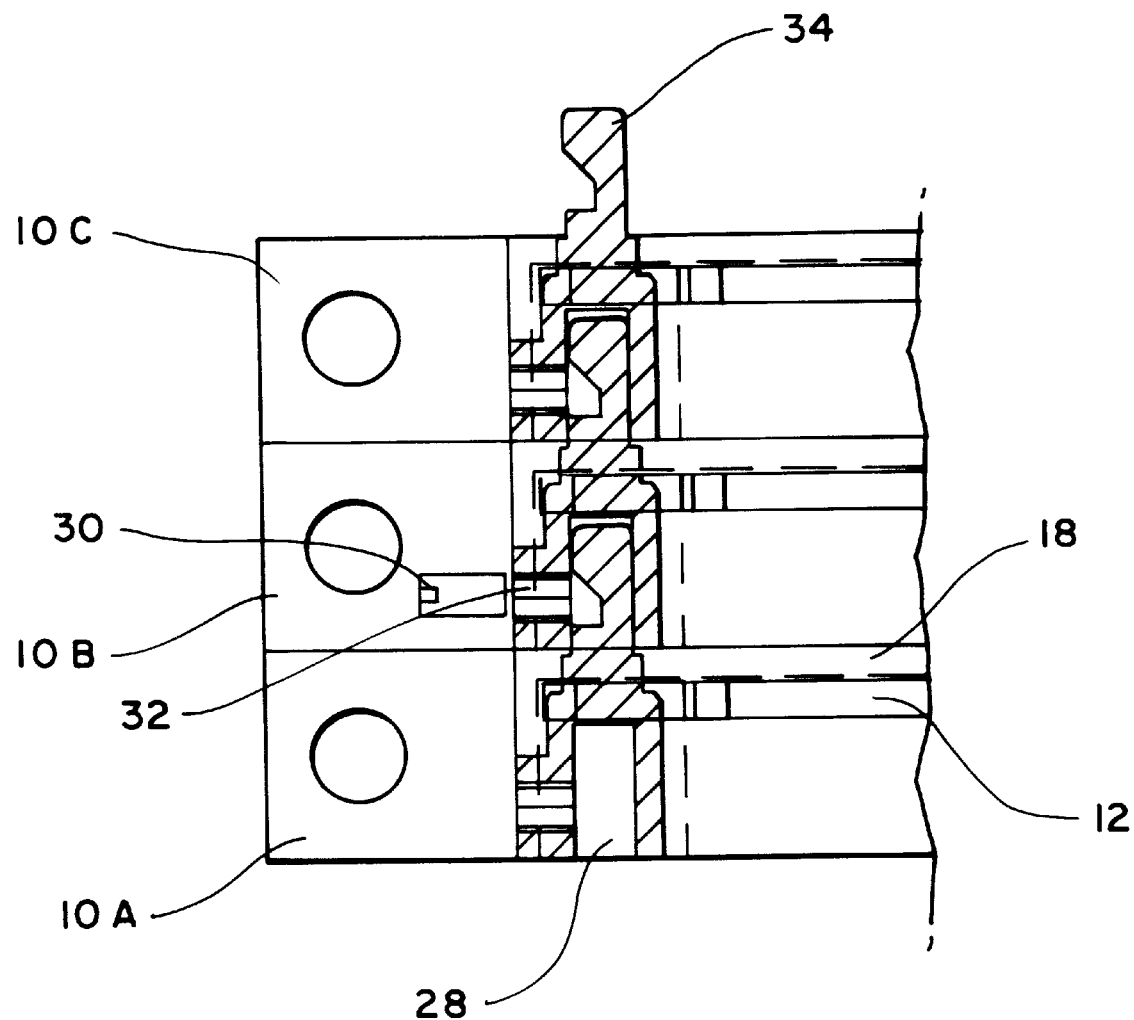
FIG. 3 is a cross-sectional view of three interlocking packaging modules.

FIGS. 2 and 3 show one of the interlocking techniques in more detail. Each retaining element 26 includes an alignment pin 34 having an inclined notch 31, a receptacle or alignment hole 28, and a mounting element 32. The receptacle 28 of one slice receives the alignment pin 34 from an adjacent slice during mating. The locking element 30, such as a set screw, passes through the mounting element 32 and presses or rides against the inclined notch 31 of the alignment pin 34, pulling in contact with the housing of the corresponding slice. The force of the locking element 30 against the inclined notch 31 of the alignment pin 26 prevents the pin 26 from leaving the receptacle 28 under normal loads and thus provides structural support to the packaging system. An individual slice is removed from the system by disengaging the set screws from the guide pins on that slice and then sliding the slice away from the system. Interlocking the slices in this manner provides increased structural reliability while still allowing the addition and removal of individual slices without disassembling the entire system.

Figure 4A:
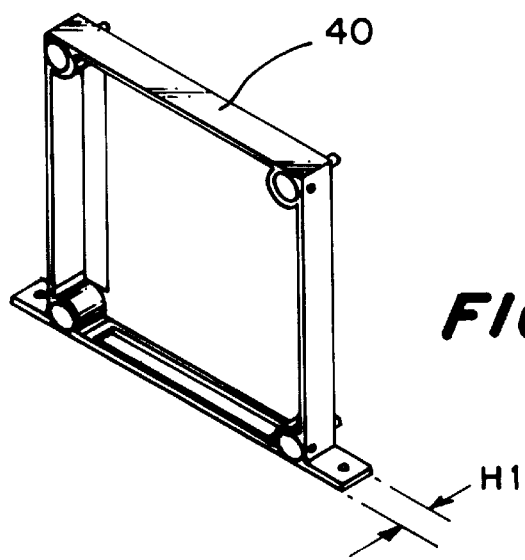
FIGS. 4A, 4B, and 4C are cross-sectional views of three types of packaging modules.
Figure 4B:
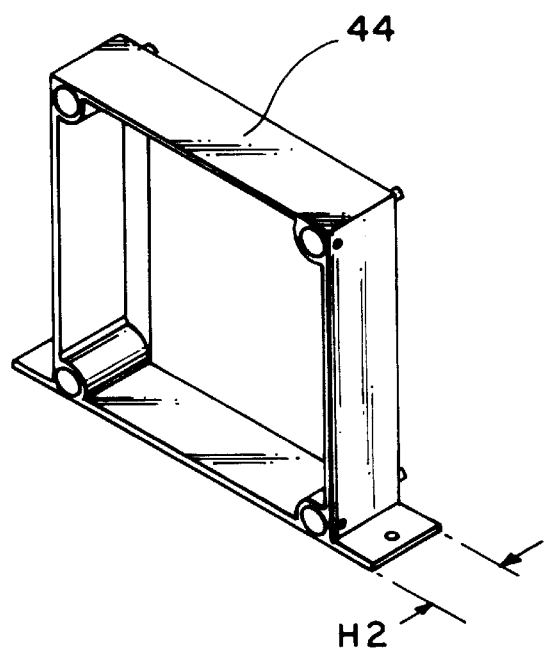
Figure 4C:
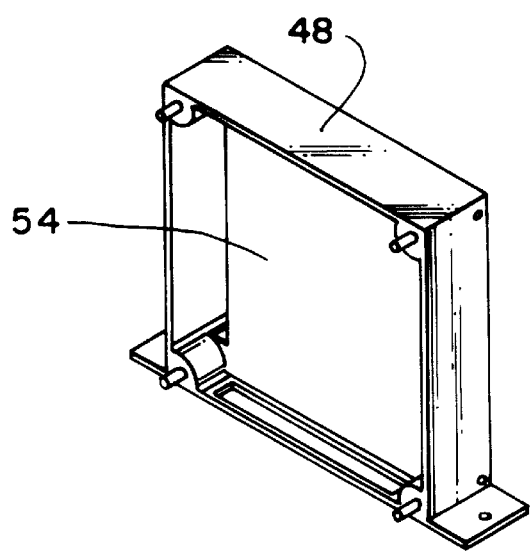

FIGS. 4A, 4B and 4C show three slice configurations, all of which can be accommodated in a horizontally mounted packaging system. The slice 40 of FIG. 4A is a single-wide slice that holds a single electronic circuit with a given maximum height H1. The slice 44 of FIG. 4B is a double-wide slice that holds a single electronic circuit with a given maximum height H2. The maximum height H2 of the double-wide slice 44 is often an integer multiple (e.g., two) of the maximum height H1 of the single-wide slice 42. The slice 48 of FIG. 4C is a double-sided slice 48 that holds two electronic circuits, each with maximum height of H1. A wall 54 separates the two circuits in the double-layer slice 48 and provides a thermal path from the circuits to the base structure. These modules 40, 44, 48 can be connected in virtually any combination to form a packaging assembly of virtually any length.

Other embodiments are within the scope of the following claims. For example, in some applications the packaging modules have shapes other than those described, such as cylindrical or triangular-prismatic. Also, while the invention has been described primarily in terms of space-based applications, modular electronic packaging systems like those described here are useful in a wide variety of applications, including commercial applications such as automotive and power generation applications. Moreover, other implementations of the horizontally mounted packaging system do not require all of the slices to mount directly to the base structure. In these systems, some of the slices mount to the base structure, while the remaining slices are held in position by their retainer/receptacle assemblies. In most of these systems, all of the slices contact the base structure to provide a direct thermal path from the enclosed electronic circuit to the base structure. Other embodiments use interlocking mechanisms other than set screws, such as studs protruding from the guide pins into corresponding recesses in the receptacles.

What is claimed is:

1. A modular electronics packaging system having multiple packaging slices, the system comprising:

a first packaging slice having:
a first electronic circuit;
a first housing that holds the first electronic circuit;
one or more retainers protruding from the first housing; and
a first conduit formed in the first housing to allow electrical connection to the first electronic circuit;

a second packaging slice having:
a second electronic circuit;
a second housing that holds the second electronic circuit;
one or more receptacles formed in the second housing, each coupled to one of the retainers protruding from the first packaging slice; and
a second conduit formed in the second housing to allow electrical connection to the second electronic circuit; and one or more interlocking elements formed in one or more of the receptacles of the second packaging slice to interlock with one or more of the retainers extending from the first packaging slice, wherein at least one of the interlocking elements includes a set screw to engage one of the retainers.

2. The system of claim 1, wherein the interlocking element includes a hole formed in the second housing to accommodate the set screw.

3. The system of claim 1, wherein each housing includes at least four walls defining a cavity in which the electronic circuit resides.

4. The system of claim 3, wherein each housing includes at least one web enclosing an end of the cavity.

5. The system of claim 1, wherein each housing comprises a structurally rigid material.

6. The system of claim 1, wherein each housing comprises a thermally conductive material.

7. The system of claim 1, wherein each housing includes at least one mounting element to mount the packaging slice to an external structure.

8. A modular electronics packaging system having at least two packaging slices, the system comprising:

a first packaging slice having:
a first electronic circuit;
a structurally rigid and thermally conductive first housing having at least four walls and at least one web defining a cavity to hold the first electronic circuit;
at least one mounting element formed on the first housing to mount the first packaging slice to an external structure;
multiple retainers protruding from the housing and each having an interlocking element; and
a first conduit formed in the first housing to allow electrical connection to the first electronic circuit; and a second packaging slice having:
a second electronic circuit;
a structurally rigid and thermally conductive second housing having at least four walls and at least one web defining a cavity to hold the second electronic circuit;

at least one mounting element formed on the second housing to mount the second packaging slice to the external structure;

multiple receptacles formed in the second housing, each positioned to receive a corresponding one of the retainers protruding from the first packaging slice and each having an interlocking element that engages the interlocking element of the corresponding one of the retainers, wherein at least one of the interlocking elements of the multiple receptacles includes a set screw to engage one of the retainers; and a second conduit formed in the second housing to allow electrical connection to the second electronic circuit.

9. The system of claim 8, wherein at least one of the interlocking elements of the multiple receptacles includes a hole formed in the second housing to accommodate the set screw.

* * * * *